(12) United States Patent
Kim et al.

(10) Patent No.: US 12,091,748 B2
(45) Date of Patent: Sep. 17, 2024

(54) METHOD FOR FORMING RUTHENIUM THIN FILM

(71) Applicants: RESEARCH COOPERATION FOUNDATION OF YEUNGNAM UNIVERSITY, Gyeongsan-si (KR); TANAKA KIKINZOKU KOGYO K.K., Tokyo (JP)

(72) Inventors: Soo-Hyun Kim, Suseong-gu (KR); Yohei Kotsugi, Seoul (KR)

(73) Assignees: RESEARCH COOPERATION FOUNDATION OF YEUNGNAM UNIVERSITY, Gyeongsan-Si (KR); TANAKA KIKINZOKU KOGYO K.K., Tokyo (JP)

( * ) Notice: Subject to any disclaimer, the term of this patent is extended or adjusted under 35 U.S.C. 154(b) by 0 days.

(21) Appl. No.: 18/018,657

(22) PCT Filed: Jul. 29, 2021

(86) PCT No.: PCT/JP2021/028047
§ 371 (c)(1),
(2) Date: Jan. 30, 2023

(87) PCT Pub. No.: WO2022/030348
PCT Pub. Date: Feb. 10, 2022

(65) Prior Publication Data
US 2023/0212741 A1    Jul. 6, 2023

(30) Foreign Application Priority Data
Aug. 4, 2020 (JP) .................... 2020-132707

(51) Int. Cl.
*C23C 16/16* (2006.01)
*C23C 16/455* (2006.01)
*C23C 16/56* (2006.01)

(52) U.S. Cl.
CPC ........ *C23C 16/16* (2013.01); *C23C 16/45553* (2013.01); *C23C 16/56* (2013.01)

(58) Field of Classification Search
CPC .... C23C 16/16; C23C 16/45553; C23C 16/56
See application file for complete search history.

(56) References Cited

U.S. PATENT DOCUMENTS

| 5,962,716 A | 10/1999 | Uhlenbrock et al. |
| 6,303,809 B1 | 10/2001 | Chi et al. |

(Continued)

FOREIGN PATENT DOCUMENTS

| JP | 2000-281694 A | 10/2000 |
| JP | 2002-212112 A | 7/2002 |

(Continued)

OTHER PUBLICATIONS

Chung et al., "Electrical and Structural Properties of Ruthenium Film Grown by Atomic Layer Deposition using Liquid-Phase Ru(CO)$_3$ (C$_6$H$_8$) Precursor," Materials Research Society, vol. 990, 2007 (8 pages).

(Continued)

*Primary Examiner* — Michael G Miller
(74) *Attorney, Agent, or Firm* — Foley & Lardner LLP

(57) ABSTRACT

The present invention relates to a ruthenium thin film-forming method for forming a ruthenium thin film using a ruthenium precursor, in which tricarbonyl ($\eta^4$-methylene-1, 3-propanediyl) ruthenium ((CO)$_3$Ru-TMM)) having a structure represented by the following formula 1 is used as the ruthenium precursor, and the method includes a stage of forming a ruthenium thin film by an atomic layer deposition at a temperature ranging from 200° C. to 350° C. using this ruthenium precursor and a reaction gas. As the reaction gas, one or more selected from the group consisting of oxygen, hydrogen, water and ammonia are preferably applied.

(Continued)

[Formula 1]

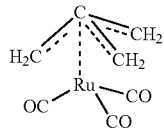

11 Claims, 9 Drawing Sheets

(56) References Cited

U.S. PATENT DOCUMENTS

| | | | |
|---|---|---|---|
| 6,465,669 | B1 | 10/2002 | Okamoto |
| 2011/0165780 | A1* | 7/2011 | Kanjolia ........... C23C 16/45525 438/785 |
| 2011/0318488 | A1 | 12/2011 | Saito et al. |
| 2022/0018018 | A1* | 1/2022 | Harada ................... C07F 15/00 |

FOREIGN PATENT DOCUMENTS

| | | |
|---|---|---|
| JP | 2011-522124 A | 7/2011 |
| JP | 2012-006858 A | 1/2012 |
| JP | 2020-090689 A | 6/2020 |

OTHER PUBLICATIONS

International Searching Authority, "International Search Report," issued in connection with International Patent Application No. PCT/JP2021/028047, dated Sep. 7, 2021.

International Searching Authority, "Written Opinion," issued in connection with International Patent Application No. PCT/JP2021/028047, dated Sep. 7, 2021.

Mui et al., "Facile Preparation of Ru(CO)3(R-DAB) and its Relation to the Reversible C—C Bond Formation and Fission between Two R-DAB Ligands on a Diruthenium Fragment", Inorganic Chemistry, vol. 29, No. 12, Jun. 1, 1990, pp. 2336-2345.

Zanders et al., "Unveiling Ruthenium(II) Diazadienyls for Gas Phase Deposition Processes: Low Resistivity Ru Thin Films and Their Performance in the Acidic Oxygen Evolution Reaction", Advanced Materials Interfaces, vol. 9, Oct. 26, 2022, pp. 1-14.

* cited by examiner

METHOD FOR FORMING RUTHENIUM THIN FILM

CROSS-REFERENCE TO RELATED APPLICATIONS

The present application claims priority under 35 U.S.C. § 371 to International Patent Application No. PCT/JP2021/028047, filed Jul. 29, 2021, which claims priority to and the benefit of Japanese Patent Application No. 2020-132707, filed on Aug. 4, 2020. The contents of these applications are hereby incorporated by reference in their entireties.

BACKGROUND OF THE INVENTION

Field of the Invention

The present invention relates to a ruthenium thin film-forming method, and more particularly to a method for forming a ruthenium thin film by an atomic layer deposition (ALD).

Description of the Related Art

In response to the miniaturization of semiconductor devices, the miniaturization of wirings is also underway, an increase in wiring resistance and coupling capacitance between wirings causes RC delay, and the high-speed operation of elements is hindered. In order to solve these problems, copper (Cu) which has low bulk resistance is used as a wiring material, and low dielectric constant films (low-k films) are in use as interlayer dielectric films.

However, additional miniaturization creates a new problem for copper wirings. In the case of a 10 nm-class semiconductor element wiring, the width of the wiring becomes smaller than the electron mean free path of copper, which is approximately 38.7 nm, and scattering causes an increase in the resistance value. Specifically, the resistance value of a wiring is expressed by the sum of a resistance coefficient attributed to surface scattering and a resistance coefficient attributed to grain boundary scattering. The resistance coefficient attributed to surface scattering and the resistance coefficient attributed to grain boundary scattering are proportional to all mean free paths. Therefore, when the width of a wiring becomes smaller than the electron mean free path, collision with the wiring side surface or grain boundaries becomes dominant, and the resistance value attributed to scattering increases. This problem becomes more serious as the miniaturization of wirings proceeds. Therefore, as the miniaturization of wirings proceeds, the advantage of copper as a wiring material becomes smaller, and, currently, studies for new alternative wiring materials to copper are in need.

As a new alternative wiring material to copper, studies are underway regarding ruthenium (Ru) which has a bulk resistance value that is not as low as that of copper, but has a shorter electron mean free path than copper. Specifically, a ruthenium bulk has a resistance value of 7.1 $\mu\Omega \cdot cm$, which is higher than the counterpart of 1.7 $\mu\Omega \cdot cm$. However, the electron mean free path of ruthenium is 10.8 nm, which is extremely shorter than the mean free path of copper (38.7 nm). Therefore, the application of ruthenium makes the resistance values of wirings smaller as the miniaturization of wirings proceeds.

In addition, the melting point of ruthenium is 2334° C. and is higher than 1085° C., which is the melting point of copper. Therefore, ruthenium is also more advantageous than copper in terms of electromigration resistance and enables improvement in the service lives of wirings.

As described above, ruthenium has many advantages as a wiring material. In addition, in order to use ruthenium for wirings, there is a need to develop a method for forming a ruthenium thin film that has low resistivity at low temperatures. As a method for producing such a ruthenium thin film that serves as wirings or electrodes in semiconductor devices, chemical deposition methods such as an atomic layer deposition are known. In addition, as a ruthenium precursor that is used in the chemical deposition methods, many organoruthenium compounds have been thus far known.

As the organoruthenium compounds, which are raw materials for chemical deposition, for example, Patent Document 1 discloses bis(ethylcyclopentadienyl)ruthenium (II). In addition, Patent Document 2 discloses dicarbonyl-bis(tetramethylheptanedionato)ruthenium or tris(acetylacetonato)ruthenium. Furthermore, Patent Document 3 and Non Patent Document 1 disclose (1,3-cyclohexadiene) tricarbonyl ruthenium, and Patent Document 4 discloses dicarbonyl-bis(5-methyl-2,4-hexanediketonato)ruthenium.

PATENT ART DOCUMENT

Patent Document

Patent Document 1
  Japanese Patent Application Laid-Open No. 2000-281694
Patent Document 2
  U.S. Pat. No. 6,303,809
Patent Document 3
  U.S. Pat. No. 5,962,716
Patent Document 4
  Japanese Patent Application Laid-Open No. 2012-006858

Non Patent Document

Non Patent Document 1
  Materials Research Society Symposium B-Materials, Processes, Intergration and Reliability in Advanced Interconnects for Micro- and Nanoelectronics, 2007, 990.0990-B08-01

SUMMARY OF THE INVENTION

Technical Problem

A technical problem to be solved by the present invention intends to achieve is to provide a method for forming a ruthenium thin film that has a low specific resistance at low temperatures.

Solution to Problem

In order to achieve the above-described technical problem, in one example of a ruthenium thin film-forming method of the present invention, a ruthenium precursor represented by tricarbonyl ($\eta^4$-methylene-1,3-propanediyl) ruthenium ($C_7H_6O_3Ru((CO)_3Ru$-TMM)) is used, and a ruthenium thin film can be formed at a temperature ranging from 200° C. to 350° C. by an atomic layer deposition (ALD) with the ruthenium precursor and a reaction gas.

In an embodiment of the method for forming a ruthenium thin film of the present invention, the reaction gas can be one or more selected from the group consisting of oxygen ($O_2$), hydrogen ($H_2$), water ($H_2O$) and ammonia ($NH_3$).

In an embodiment of the method for forming a ruthenium thin film of the present invention, the reaction gas is oxygen ($O_2$), and the ruthenium thin film can be formed at a pressure ranging from 0.1 to 10 Torr.

In an embodiment of the method for forming a ruthenium thin film of the present invention, the reaction gas is hydrogen ($H_2$), and the ruthenium thin film can be formed at a pressure ranging from 10 to 50 Torr.

In an embodiment of the method for forming a ruthenium thin film of the present invention, the specific resistance of the ruthenium thin film can be 20 μΩ·cm or less.

An embodiment of the method for forming a ruthenium thin film of the present invention can further include a stage of thermally treating the ruthenium thin film after a stage of forming the ruthenium thin film.

In an embodiment of the method for forming a ruthenium thin film of the present invention, the thermal treatment stage can be carried out at a temperature of 500° C. or lower.

In an embodiment of the method for forming a ruthenium thin film of the present invention, the specific resistance of the thermally-treated ruthenium thin film can be 10 μΩ·cm or less.

Advantageous Effects of Invention

The present invention forms a ruthenium thin film by using a ruthenium precursor expressed by tricarbonyl ($\eta^4$-methylene-1,3-propanediyl) ruthenium ($C_7H_6O_3Ru((CO)_3Ru$-TMM)) and ALD, whereby it is possible to form a ruthenium thin film that has an extremely low specific resistance of 20 μΩ·cm even at low temperatures of 350° C. or lower. In addition, in the ruthenium thin film-forming method of the present invention, the incubation time is short, the growth speed is extremely high, and the productivity is high. However, these effects are exemplary, and the scope of the present invention is not limited by the above-described effects.

DETAILED DESCRIPTION OF THE PREFERRED EMBODIMENTS

Figure 1:
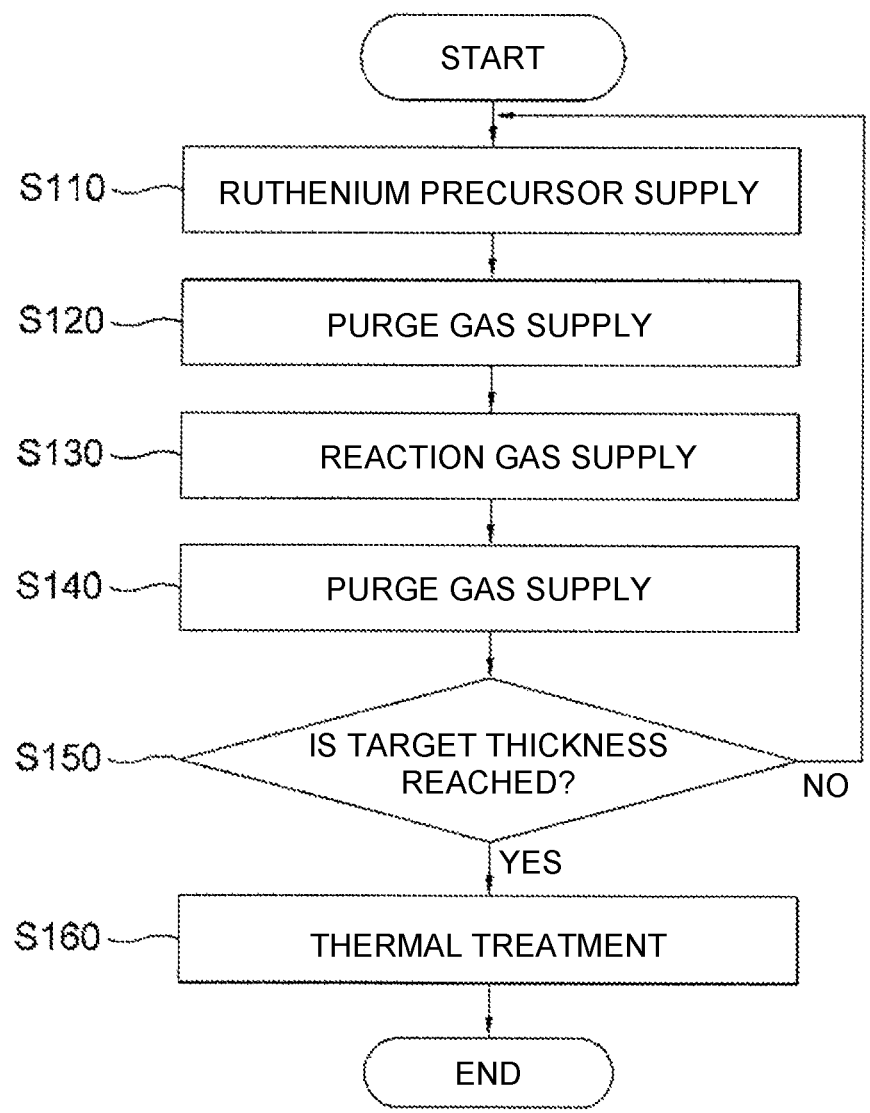
FIG. 1 is a flowchart schematically showing an implementing process of one embodiment of a method for forming a ruthenium thin film using a ruthenium precursor represented by tricarbonyl ($\eta^4$-methylene-1,3-propanediyl) ruthenium ($C_7H_6O_3Ru((CO)_3Ru$-TMM))

Hereinafter, an example of the present invention will be described in detail with reference to the accompanying drawings. The example of the present invention is provided to describe the present invention more completely to persons skilled in the art, the following example can be modified into several different forms, and the scope of the present invention is not limited to the following example. Rather, this example is provided to further fulfil and complete the present disclosure and to completely deliver the concept of the present invention to persons skilled in the art.

In addition, in the accompanying drawings, modification of shapes shown in the drawings based on, for example, producing techniques and/or tolerance can be expected. Therefore, the example of the present invention is supposed to be not interpreted to be limited to specific shapes in regions described in the present specification and to include, for example, changes in shapes brought in production processes. The same reference sign means the same element throughout the present specification. Furthermore, a variety of elements and regions in the drawings are schematically drawn. Therefore, the present invention is not limited by relative dimensions or intervals drawn in the accompanying drawings.

The present invention relates to a method for forming a ruthenium thin film using a ruthenium precursor expressed by tricarbonyl ($\eta^4$-methylene-1,3-propanediyl) ruthenium ($C_7H_6O_3Ru((CO)_3Ru$-TMM)), in which a ruthenium thin film is formed by an atomic layer deposition with the ruthenium precursor and a reaction gas. When a ruthenium thin film is formed with the ruthenium precursor and a reaction gas, it is possible to deposit a ruthenium thin film that has a specific resistance of 20 μΩ·cm or less even at low temperatures of 350° C. or lower. The ruthenium precursor has a structure shown in the following formula 1.

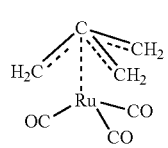

[Formula 1]

An atomic layer deposition is a method for forming a thin film by alternately supplying a precursor and a reaction gas onto a substrate. After each of the supply of the precursor and the supply of the reaction gas, a purge gas is supplied to purge the precursor and the reaction gas that remain in the chamber. When the precursor is supplied onto the substrate, the substrate and the precursor react with each other to form a layer of the precursor on the entire surface of the substrate. Once one layer of the precursor is formed on the entire surface of the substrate, even when the precursor is continuously supplied afterward, the additionally-supplied precursor is accumulated on the layer of the precursor. This accumulated precursor is removed by the purge gas that is supplied after the supply of the precursor. Also in the case of supplying the reaction gas, a thin film is formed by the same mechanism. That is, when the reaction gas is supplied to the precursor that has been formed on the entire surface of the substrate, the reaction gas and the precursor react with each other, and, once the reaction ends as a whole, additional reaction does not occur even when the reaction gas is continuously supplied. In addition, the residual reaction gas is removed by the purge gas that is supplied after the supply of the reaction gas.

Hereinafter, the example of the present invention will be described in detail with reference to the accompanying drawings.

[Method for Forming Ruthenium Thin Film by Atomic Layer Deposition]

Figure 2:
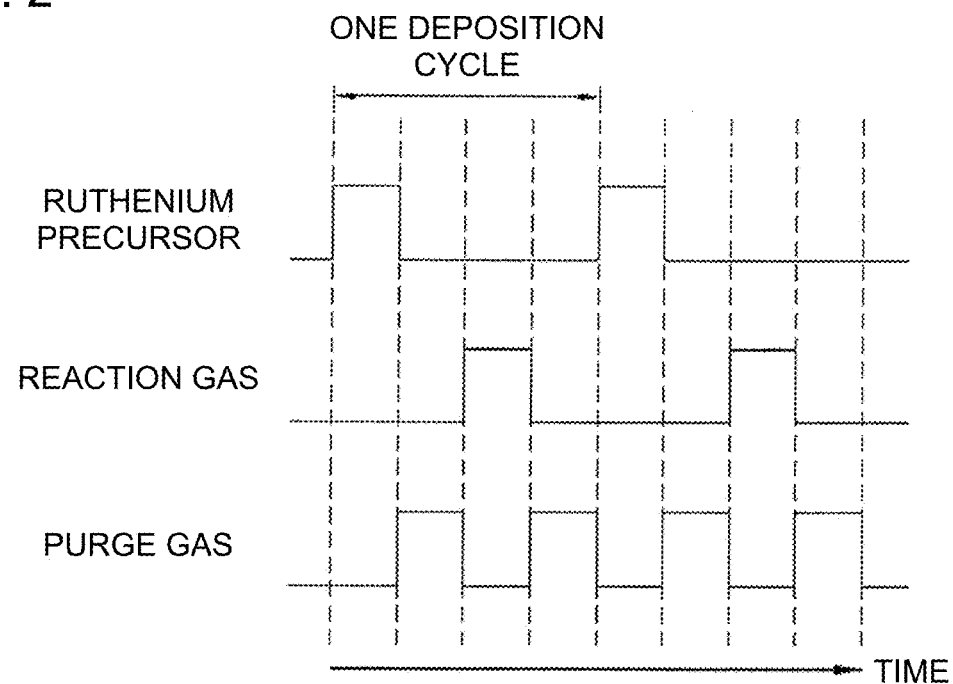
FIG. 2 is a view simply showing a gas injection flow of an atomic layer deposition for describing an example of a method for forming a ruthenium thin film of the present invention.

FIG. 1 is a flowchart schematically showing an implementing process of one embodiment of a method for forming a ruthenium thin film using a ruthenium precursor expressed by tricarbonyl ($\eta^4$-methylene-1,3-propanediyl) ruthenium ($C_7H_6O_3Ru$ (($CO)_3Ru$-TMM)). FIG. 2 is a view simply showing the gas injection flow of an atomic layer deposition for describing an example of the method for forming a ruthenium thin film of the present invention.

When FIG. 1 and FIG. 2 are referred to, in the method for forming a ruthenium thin film of one embodiment of the present invention, first, a ruthenium precursor that has the structure of formula 1 and is represented by tricarbonyl ($\eta^4$-methylene-1,3-propanediyl) ruthenium ($C_7H_6O_3Ru$ (($CO)_3Ru$-TMM)) is supplied onto a substrate (S110).

In a case where a reaction gas that is to be supplied in an S130 stage to be described below is oxygen, it is preferable to adjust the pressure of each chamber to be in a range of 0.1 to 10 Torr before the stage of supplying the ruthenium precursor onto the substrate. In addition, in a case where the reaction gas that is to be supplied in the S130 stage to be described below is hydrogen, it is preferable to adjust the pressure of each chamber to be in a range of 10 to 50 Torr before the stage of supplying the ruthenium precursor onto the substrate. An inert gas can be further supplied into the chamber in order to adjust the pressure in the chamber. In this case, as the inert gas, the same gas as a purge gas that is supplied in an S120 stage or an S140 stage can be used, but the inert gas is not limited thereto.

In addition, the temperature of the substrate is preferably adjusted to be 200° C. to 350° C. Furthermore, if necessary, it is possible to carry out a preliminary cleaning step and remove an etching residue or a surface impurity that can be present on the substrate prior to the S110 stage. As the preliminary cleaning step, it is possible to use cleaning in which argon (Ar) sputtering is used or a cleaning step in which a wet cleaning agent is used.

After the stage of supplying the ruthenium precursor onto the substrate, the ruthenium precursor is purged (S120). As the purge gas, an argon (Ar), helium (He) or nitrogen ($N_2$) gas or the like is preferably used. A residual by-product and the ruthenium precursor that is not adsorbed on the substrate are removed with the purge gas.

Next, the reaction gas is supplied onto the substrate (S130). The reaction gas is a reducing gas that reduces the ruthenium precursor adsorbed on the substrate. The reaction gas is preferably one or more selected from the group consisting of oxygen ($O_2$), hydrogen ($H_2$), water ($H_2O$) and ammonia ($NH_3$). Particularly, oxygen or hydrogen is preferably used since the characteristics of a formed ruthenium thin film are excellent.

After the stage of supplying the reaction gas to the substrate, the reaction gas is purged (S140). As the purge gas, an argon (Ar), helium (He) or nitrogen ($N_2$) gas or the like is preferably used.

The above-described S110 to S140 stages are each implemented once in the above-described order, and these stages form one deposition cycle. This deposition cycle can be repeated a plurality of times depending on the target thickness of a ruthenium thin film.

In addition, when a ruthenium thin film having the target thickness is formed (S150), a stage of thermally treating the ruthenium thin film (S160) is preferably included. The stage of thermally treating the ruthenium thin film (S160) can be carried out at a temperature of 500° C. or lower in a hydrogen ($H_2$) atmosphere for approximately 10 minutes.

[Formation Result of Ruthenium Thin Film of Present Embodiment]

Next, the present invention, mainly, the results of the formation of a ruthenium thin film of one embodiment of the present invention will be described with reference to FIG. 3 to FIG. 10.

Figure 3:
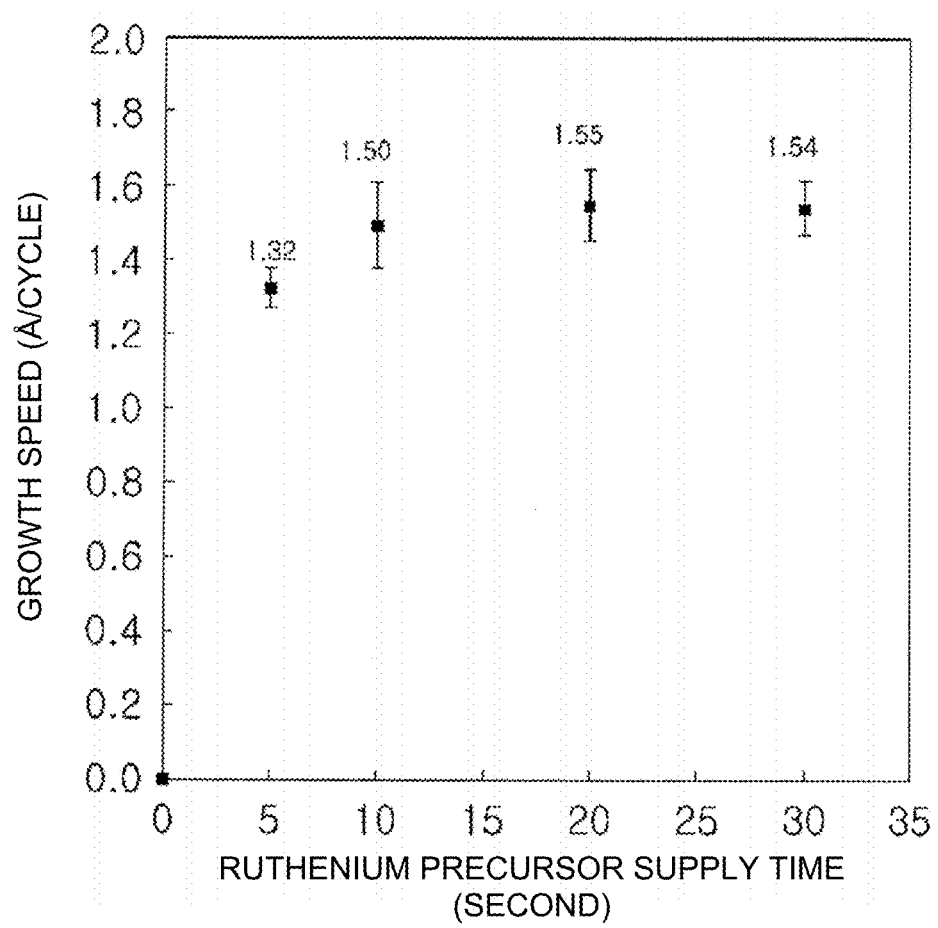
FIG. 3 is a view showing the growth speed of a ruthenium thin film with respect to the ruthenium precursor supply time in the method for forming a ruthenium thin film of the present invention in which an atomic layer deposition is used.
Figure 4:
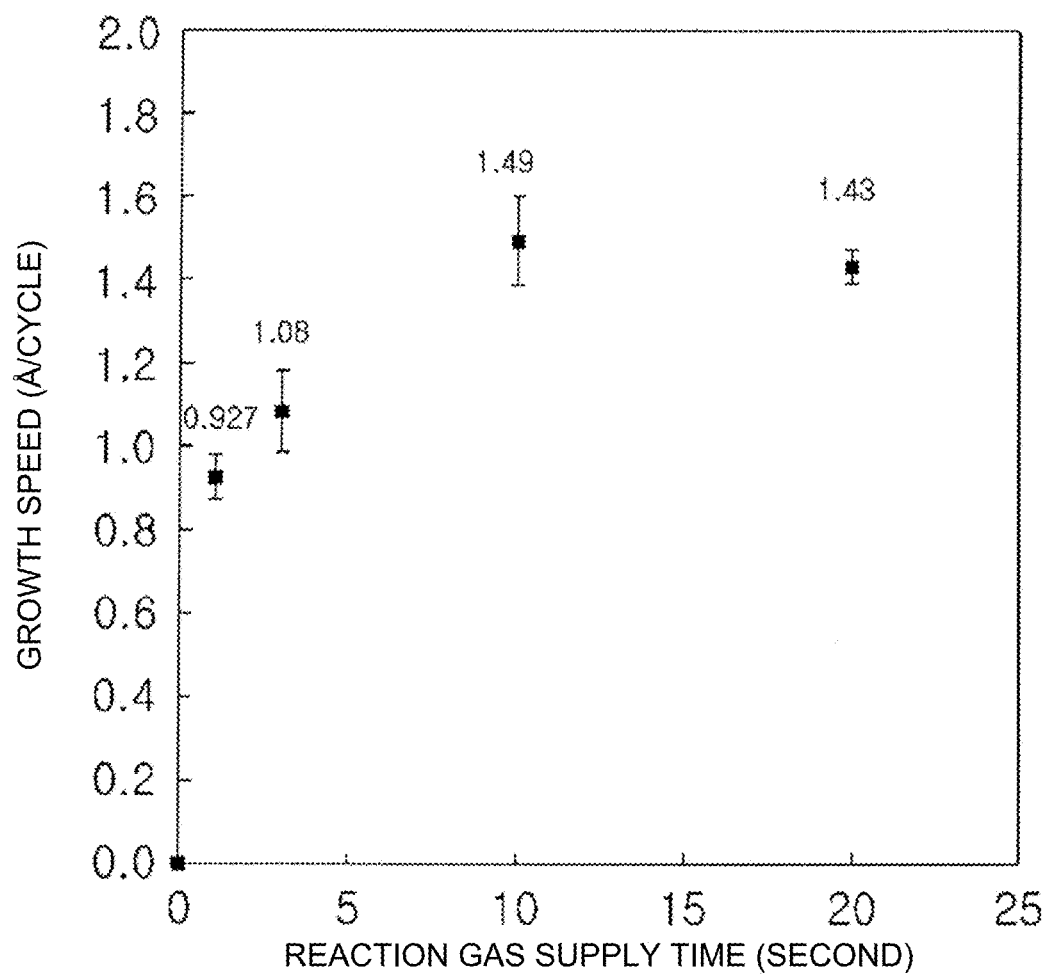
FIG. 4 is a view showing the growth speed of a ruthenium thin film with respect to the supply time of an oxygen gas, which is a reaction gas, in the method for forming a ruthenium thin film of the present invention in which an atomic layer deposition is used.

FIG. 3 is a view showing the growth speed of the ruthenium thin film with respect to the ruthenium precursor supply time in the method for forming a ruthenium thin film of the present invention in which an atomic layer deposition is used. FIG. 4 is a view showing the growth speed of the ruthenium thin film with respect to the gas supply time of the reaction gas in the ruthenium thin film-forming method of the present invention in which an atomic layer deposition is used. In this case, the ruthenium precursor was a ruthenium precursor that has the structure of formula 1, the reaction gas was an oxygen gas and, as a carrier gas and the purge gas, a nitrogen gas was used. In addition, the substrate temperature was maintained at 220° C., and the chamber pressure was 1 Torr. The purge gas was supplied for 10 seconds.

When FIG. 3 and FIG. 4 are referred to, until the ruthenium precursor supply time and the reaction gas supply time are set to 10 seconds, the growth speed of the ruthenium thin film increases with an increase in each supply time. In addition, when the ruthenium precursor supply time and the reaction gas supply time become 10 seconds or longer, no increase in the growth speed of the ruthenium thin film was observed. This means that the saturation time of the reaction step between the ruthenium precursor and the reaction gas is 10 seconds. Therefore, the ruthenium precursor or the reaction gas is preferably supplied for 10 seconds in order to suppress the waste of the ruthenium precursor and the reaction gas and to shorten the step time.

Figure 5:
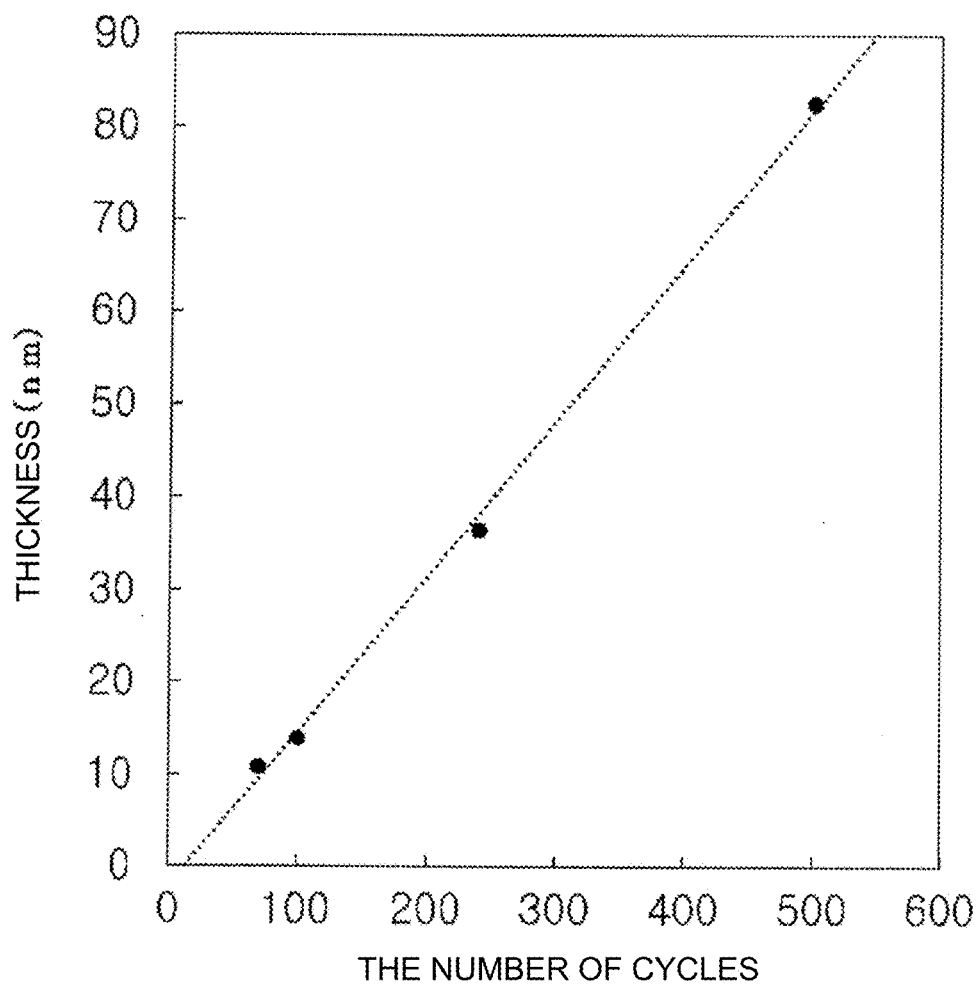
FIG. 5 is a view showing the thickness of a thin film with respect to the number of cycles in the method for forming a ruthenium thin film of the present invention in which an atomic layer deposition is used.

FIG. 5 is a view showing a relationship between the number of the deposition cycles and the thickness of the thin film in the method for forming a ruthenium thin film of the present invention in which an atomic layer deposition is used. In this case, the ruthenium precursor was a ruthenium precursor that has the structure of formula 1, the reaction gas was an oxygen gas and, as a carrier gas and the purge gas, a nitrogen gas was used. In addition, the chamber pressure was set to 1 Torr while the substrate temperature was maintained at 220° C. In addition, the ruthenium precursor, the reaction gas and the purge gas were each supplied for 10 seconds.

When FIG. 5 is referred to, it is found that the deposition thickness of the ruthenium thin film per deposition cycle (S110 to S140) becomes constant at approximately 0.17 nm. This shows a typical form of an atomic layer deposition. In addition, it is found that the number of the incubation cycles is as extremely small as approximately 15, and the ruthenium precursor that has the structure of formula 1 is a precursor extremely suitable to be applied to an atomic layer deposition.

Figure 6:
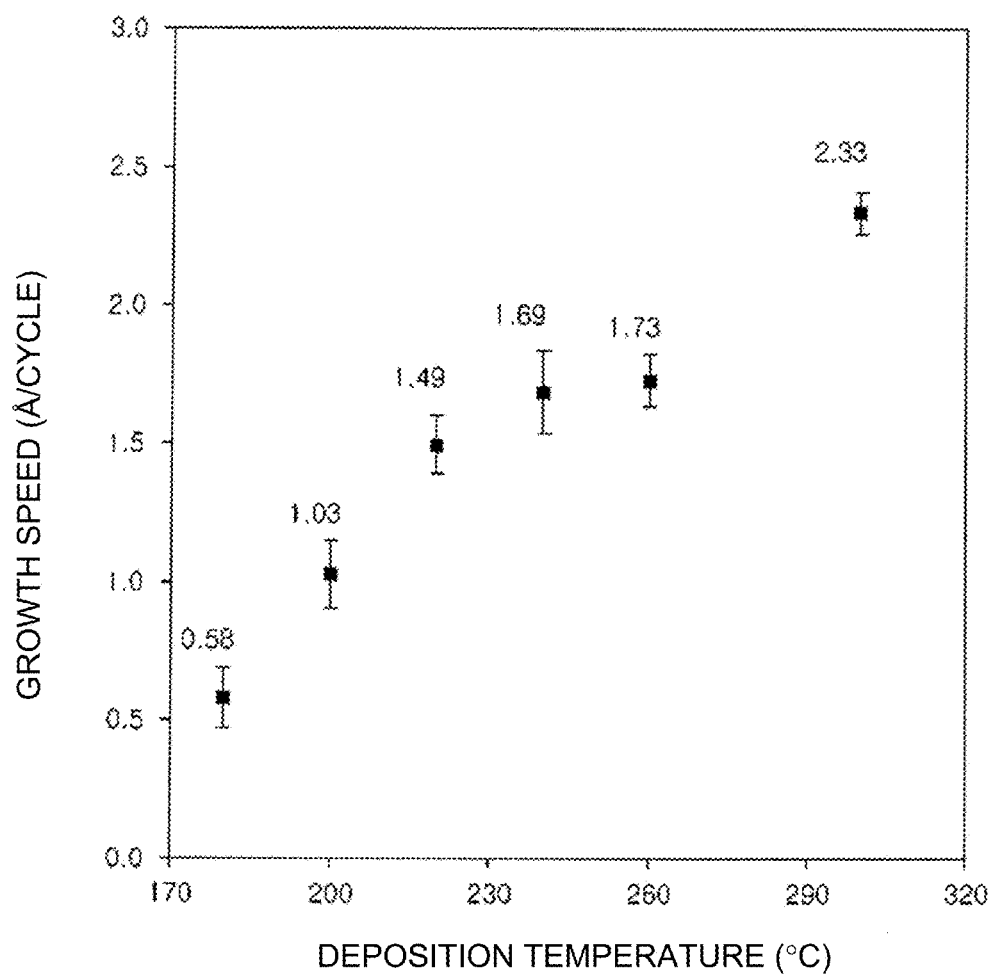
FIG. 6 is a view showing the growth speed of a ruthenium thin film with respect to the deposition temperature in the method for forming a ruthenium thin film of the present invention in which an atomic layer deposition is used.
Figure 7:
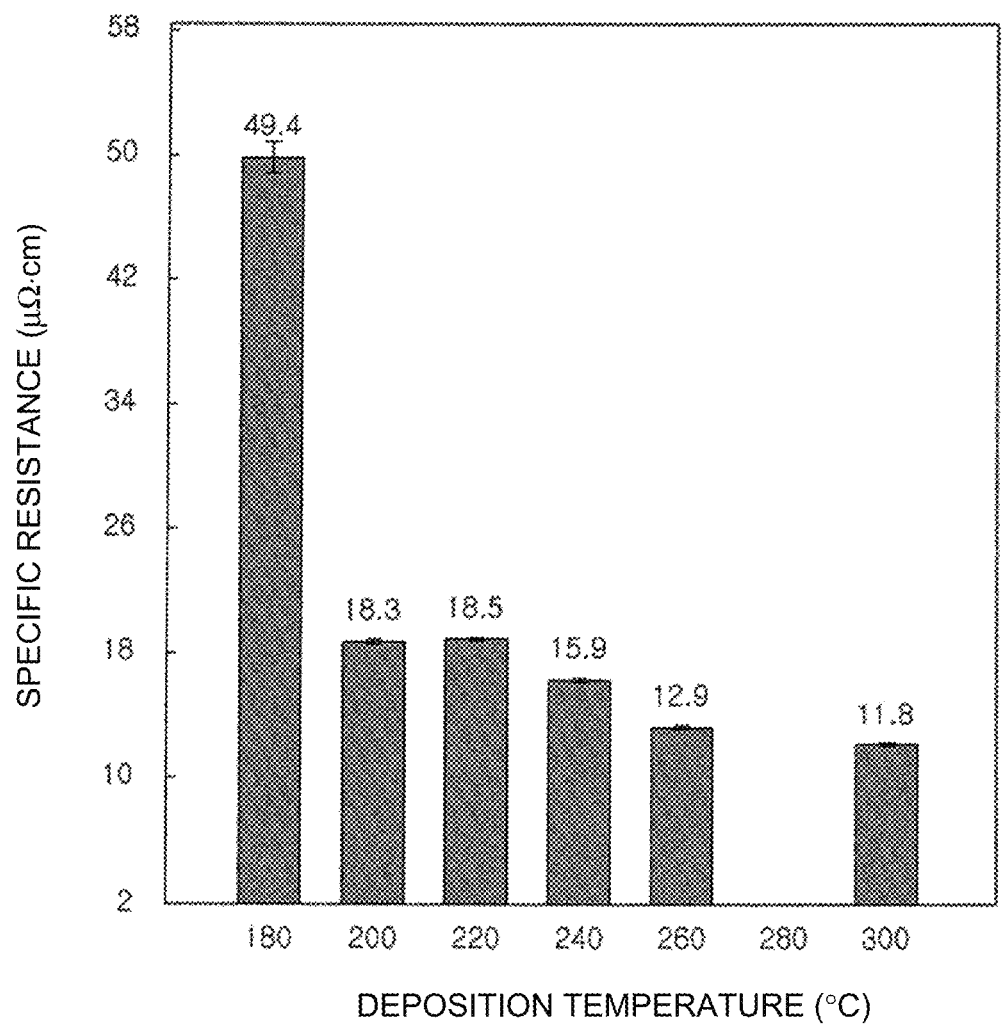
FIG. 7 is a view showing the specific resistance of a ruthenium thin film with respect to the deposition temperature in the method for forming a ruthenium thin film of the present invention in which an atomic layer deposition is used.

FIG. 6 is a view showing a relationship between the deposition temperature and the growth speed of the ruthenium thin film in the method for forming a ruthenium thin film of the present invention in which an atomic layer deposition is used, and FIG. 7 is a view showing the relationship between the deposition temperature and the specific resistance of the ruthenium thin film in the method for forming a ruthenium thin film of the present invention in which an atomic layer deposition is used. In this case, the ruthenium precursor was a ruthenium precursor that has the structure of formula 1, the reaction gas was an oxygen gas and, as a carrier gas and the purge gas, a nitrogen gas was used. In addition, the chamber pressure was set to 1 Torr. In addition, the ruthenium precursor, the reaction gas and the purge gas were each supplied for 10 seconds. When FIG. 6 and FIG. 7 are referred to, it is found that, when the deposition temperature increases, the growth speed of the ruthenium thin film increases, but the specific resistance of the formed ruthenium thin film decreases.

When the relationship between the deposition temperature and the growth speeds (FIG. 6) is observed in detail, at the deposition temperatures of 200° C. or higher, the growth speeds become 1 Å/cycle or higher, and extremely high growth speeds are exhibited. Particularly, when the deposition temperature is set to 220° C. or higher, an extremely high growth speed of approximately 1.5 Å/cycle or higher was exhibited. The ruthenium precursor that has the structure of formula 1 does not thermally decomposes at 260° C. or lower and thus exhibits an extremely high growth speed of 1.73 Å/cycle at a deposition temperature of 260° C. even when not thermally decomposed. It is found that the ruthenium precursor that has the structure of formula 1 is an extremely excellent precursor for ruthenium thin film deposition.

In addition, when the relationship between the deposition temperature and the specific resistance of the ruthenium thin film (FIG. 7) is observed in detail, in a case where the deposition temperature was 180° C., a high specific resistance of approximately 50 μΩ·cm was exhibited; however, in a case where the deposition temperature was 200° C. or higher, an extremely low specific resistance of 20 μΩ·cm or less was exhibited. Particularly, in a case where the deposition temperature was 260° C., an extremely low resistivity of 12.9 μΩ·cm was exhibited. From these facts, it is found that the use of the ruthenium precursor that has the structure of formula 1 makes it possible to form a ruthenium thin film that has an extremely low specific resistance value.

Figure 8:
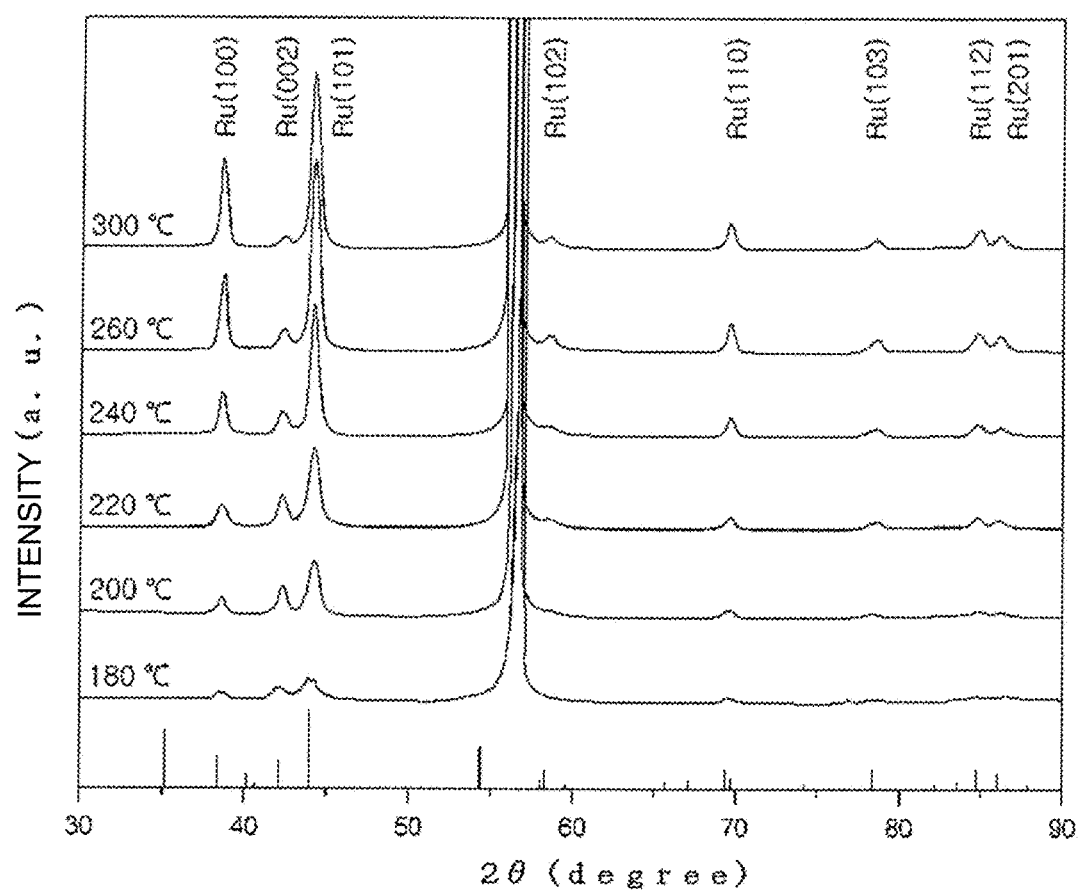
FIG. 8 is a view showing an X-ray diffraction analysis (XRD) results of a ruthenium thin film with respect to the deposition temperature in the method for forming a ruthenium thin film of the present invention in which an atomic layer deposition is used.

FIG. 8 is a view showing an X-ray diffraction analysis (XRD) results of the ruthenium thin film in a case where the deposition temperature is changed in the method for forming a ruthenium thin film of the present invention in which an atomic layer deposition is used.

When FIG. 8 is referred to, it is found that the peak of ruthenium oxide ($RuO_2$) does not appear and the peaks of metallic ruthenium significantly increase when the deposition temperature is set to 200° C. or higher.

Figure 9:
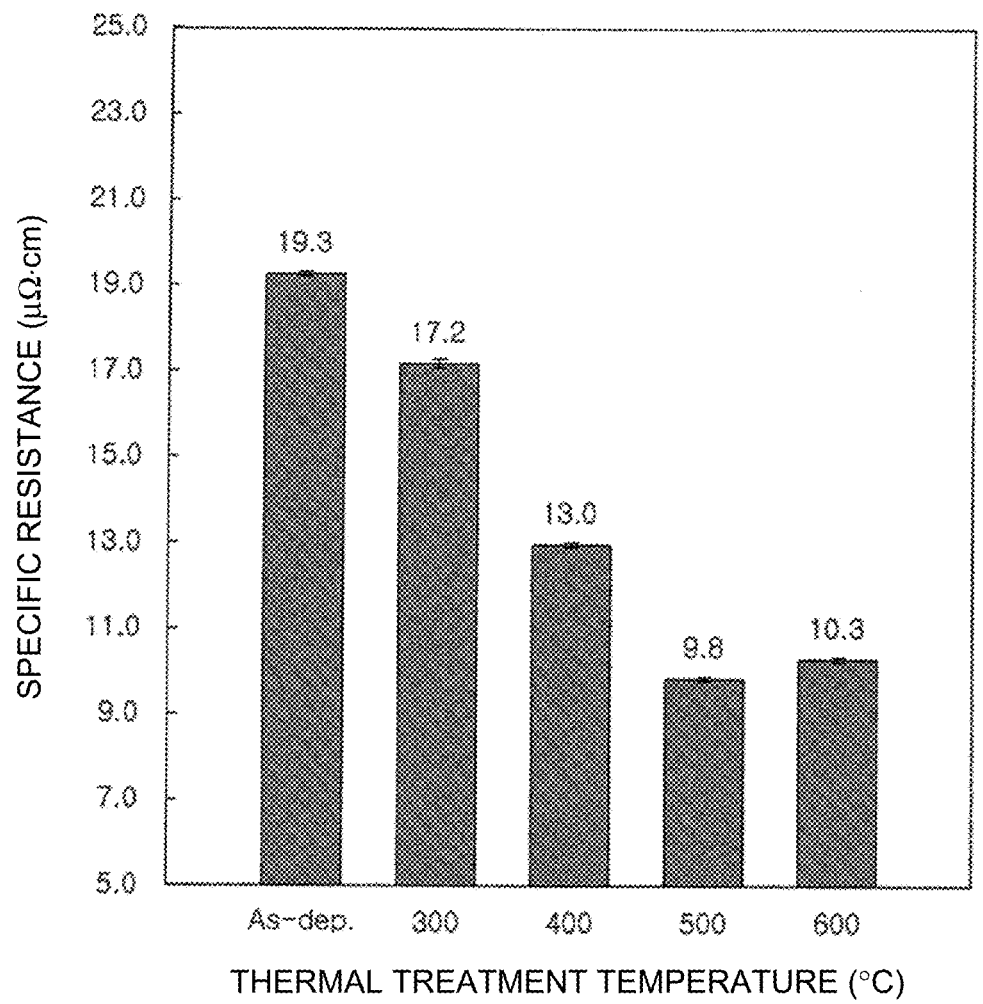
FIG. 9 is a view showing the specific resistance of a ruthenium thin film with respect to the thermal treatment temperature in the ruthenium thin film-forming method of the present invention.
Figure 10:
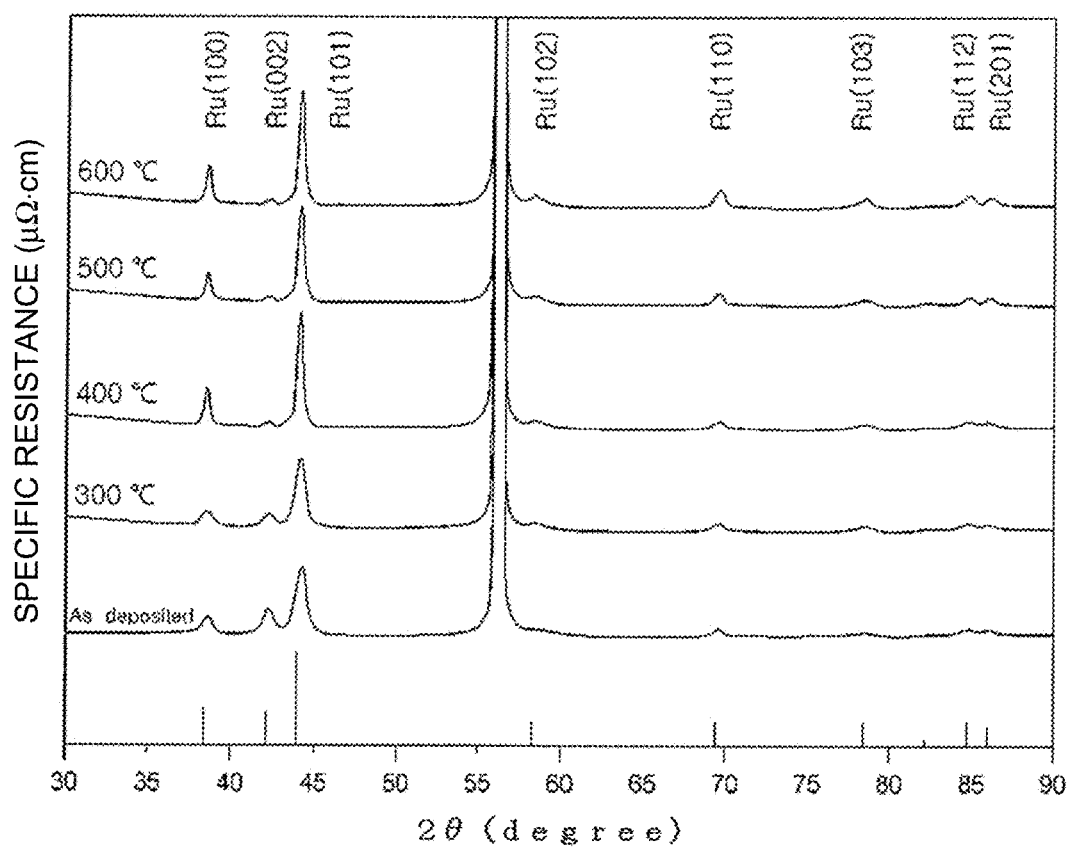
FIG. 10 is a view showing the XRD results of a ruthenium thin film with respect to the thermal treatment temperature in the ruthenium thin film-forming method of the present invention.

FIG. 9 is a view showing the relationship between the thermal treatment temperature after deposition and the specific resistance of the ruthenium thin film in the ruthenium thin film-forming method of the present invention. In addition, FIG. 10 is a view showing the XRD results of the ruthenium thin film when the thermal treatment temperature after deposition is changed in the ruthenium thin film-forming method of the present invention. The ruthenium thin film immediately after deposition (as-dep) was formed with the ruthenium precursor that has the structure of formula 1 and oxygen at a temperature of 220° C. In addition, the thermal treatment after deposition was carried out in a hydrogen atmosphere for 10 minutes.

When FIG. 9 and FIG. 10 are referred to, it is found that, as the thermal treatment temperature increases, the specific resistance of the ruthenium thin film decreases and the peaks of metallic ruthenium increase. When a change in the specific resistance of the ruthenium thin film with respect to the thermal treatment temperature is observed in detail, up to 500° C., the specific resistance of the ruthenium thin film decreases as the thermal treatment temperature increases, but the specific resistance slightly increases at a thermal treatment temperature of 600° C. Therefore, it is deemed that the thermal treatment after deposition is preferably treated at a thermal treatment temperature of 500° C. or lower. It is found that the specific resistance of the ruthenium thin film after the thermal treatment at 500° C. is a specific resistance of approximately 9.8 μΩ·cm, which is less than 10 μΩ·cm, and it is possible to form a ruthenium thin film that is excellent enough to be approximated to the bulk specific resistance (7.1 μΩ·cm) of ruthenium. That is, it is deemed that, in the case of forming a ruthenium thin film by the method of the present invention, it is possible to obtain a ruthenium thin film that has an extremely excellent specific resistance characteristic even when a low-temperature film formation step is applied.

Hitherto, the example of the present invention has been described with reference to the drawings, but the present invention is not limited to the specific example described above. It is needless to say that any person skilled in the art to which the present invention belongs can modify and carry out the present invention in a variety of manners within the scope of the gist of the present invention claimed in the claims, and such changes are within the scope described in the claims.

In addition, the scope of the present invention is shown not by the above description of the invention but by the claims to be described below, and all changes or modified forms that are derived from the meaning and scope of the claims and equivalent concept thereof are supposed to be interpreted to be in the scope of the present invention.

INDUSTRIAL APPLICABILITY

As described above, the present invention is drawn to a method for forming a ruthenium thin film by an atomic layer deposition, in which a ruthenium precursor that has the structure of formula 1 and includes tricarbonyl ($\eta^4$-methylene-1,3-propanediyl) ruthenium ($C_7H_6O_3Ru((CO)_3Ru$-TMM)) is applied. The present invention makes it possible to efficiently form a high-quality ruthenium thin film that has a low specific resistance. In addition, the method for forming a ruthenium thin film of the present invention can also cope with low-temperature film formation. The present invention is useful for forming wirings for semiconductor devices for which additional miniaturization is required in the future and can contribute to the size reduction and performance enhancement of a variety of semiconductor devices.

What is claimed is:

1. A ruthenium thin film-forming method for producing a ruthenium thin film using a ruthenium precursor,
wherein the method uses tricarbonyl ($\eta^4$-methylene-1,3-propanediyl) ruthenium (($CO)_3$Ru-TMM)) having a structure represented by the following formula 1 as the ruthenium precursor, and
the method comprises forming a ruthenium thin film having a target thickness by an atomic layer deposition at a temperature ranging from 200° ° C. to 350° C. using the ruthenium precursor and a reaction gas, and then thermally treating the formed ruthenium thin film having the target thickness after said forming is complete, wherein said thermal treating is performed at a temperature of 400° C. or more,

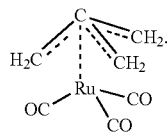

[Formula 1]

2. The method according to claim 1, wherein the reaction gas comprises one or more selected from the group consisting of oxygen ($O_2$), hydrogen ($H_2$), water ($H_2O$) and ammonia ($NH_3$).

3. The method according to claim 2, wherein the reaction gas is oxygen ($O_2$), and the method forms the ruthenium thin film at a pressure ranging from 0.1 to 10 Torr.

4. The method according to claim 3, wherein the ruthenium thin film has a specific resistance of 20 µΩ·cm or less.

5. The method according to claim 2, wherein the reaction gas is hydrogen ($H_2$), and the method forms the ruthenium thin film at a pressure ranging from 10 to 50 Torr.

6. The ruthenium thin film-forming method according to claim 5, wherein the ruthenium thin film has a specific resistance of 20 µΩ·cm or less.

7. The method according to claim 2, wherein the ruthenium thin film has a specific resistance of 20 µΩ·cm or less.

8. The method according to claim 1, wherein the ruthenium thin film has a specific resistance of 20 µΩ·cm or less.

9. The ruthenium thin film-forming method according to claim 1, wherein the thermal treatment stage is carried out at the temperature of 400° C. or more and 500° C. or lower.

10. The method according to claim 9, wherein a ruthenium thin film formed at the thermal treatment stage has a specific resistance of 10 µΩ·cm or less.

11. The method according to claim 1, wherein a ruthenium thin film formed at the thermal treatment stage has a specific resistance of 10 µΩ·cm or less.

* * * * *